(12) United States Patent
Xiao

(10) Patent No.: US 9,264,031 B2
(45) Date of Patent: Feb. 16, 2016

(54) RAIL-TO-RAIL INPUT HYSTERESIS COMPARATOR

(71) Applicant: Shanghai Huahong Grace Semiconductor Manufacturing Corporation, Shanghai (CN)

(72) Inventor: Jun Xiao, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 0 days.

(21) Appl. No.: 14/585,711

(22) Filed: Dec. 30, 2014

(65) Prior Publication Data

US 2015/0263718 A1 Sep. 17, 2015

(30) Foreign Application Priority Data

Mar. 17, 2014 (CN) .......................... 2014 1 0097613

(51) Int. Cl.
*H03K 5/22* (2006.01)
*H03K 5/24* (2006.01)
*H03K 5/125* (2006.01)

(52) U.S. Cl.
CPC .............. *H03K 5/2481* (2013.01); *H03K 5/125* (2013.01)

(58) Field of Classification Search
CPC .............. H03K 3/2893; H03K 3/3565; H03K 3/02337; H03K 3/0377; H03K 3/011; H03K 5/2481; H03K 5/249; H03K 5/24; H03K 5/2418; G01R 19/0038
USPC ................................ 327/63, 65, 67, 205, 206
See application file for complete search history.

(56) References Cited

U.S. PATENT DOCUMENTS

| | | | | |
|---|---|---|---|---|
| 5,973,515 A | * | 10/1999 | Marbot et al. | 327/65 |
| 7,973,569 B1 | * | 7/2011 | Bashar | 327/67 |
| 2013/0027107 A1 | * | 1/2013 | Nohara | 327/306 |

* cited by examiner

*Primary Examiner* — Quan Tra
(74) *Attorney, Agent, or Firm* — Muncy, Geissler, Olds & Lowe, P.C.

(57) ABSTRACT

A rail-to-rail input hysteresis comparator includes: an input hysteresis comparator module, a transmission module, an output comparator, a switching signal module and a bias module. Compared to the conventional device, the rail-to-rail input hysteresis comparator of the present invention can turn off an output of the N-type input hysteresis comparator of the input hysteresis comparator module when the common mode input voltage is relatively low and turn off an output of the P-type input hysteresis comparator of the input hysteresis comparator module when the common mode input voltage is relatively high, thereby avoiding operating in a linear mode and hence achieving a stable CMRR.

8 Claims, 7 Drawing Sheets

US 9,264,031 B2

RAIL-TO-RAIL INPUT HYSTERESIS COMPARATOR

CROSS-REFERENCES TO RELATED APPLICATIONS

This application claims the priority of Chinese patent application number 201410097613.1, filed on Mar. 17, 2014, the entire contents of which are incorporated herein by reference.

TECHNICAL FIELD

The present invention relates generally to hysteresis comparators, more particularly, to a rail-to-rail input hysteresis comparator having a stable common mode rejection ratio (CMRR) throughout the variation range of the common mode input voltage.

BACKGROUND

Generally speaking, there have been many patents issued on rail-to-rail input hysteresis comparators. However, although the circuits disclosed in these patents can meet the requirements for the application as a hysteresis comparator in the respective input voltage ranges, all of these circuits cannot perform satisfactorily in terms of common mode rejection ratio (CMRR) when the common mode input voltages are in certain ranges.

A typical rail-to-rail input hysteresis comparator includes a P-type comparator and an N-type comparator, and according to the superposition principle, the performance of the rail-to-rail input hysteresis comparator depends upon both the performance of the P-type comparator and the performance of the N-type comparator. In general cases, most operational amplifiers and comparators used in integrated circuits (ICs), including the aforementioned P-type and N-type comparators, have a differential architecture, and use of differential amplifiers is intended to take advantage of the characteristic of such devices that, for two input signals, they only amplify their respective differential components but do not amplify their common mode components. This characteristic of differential amplifiers can be measured by CMRR which is defined as the absolute value of a ratio of the amplifiers' differential gain to their common mode gain:

$$CMRR = \left|\frac{A_{DM}}{A_{CM}}\right|$$

As can be seen from its above definition, CMRR is prone to significant variation.

Although there have been proposed a variety of solutions that can overcome this drawback, they all fail to impart satisfactory CMRR properties to conventional rail-to-rail input hysteresis comparators.

FIGS. 1a and 1b show the simulation results of a conventional rail-to-rail input hysteresis comparator. As shown in these figures, with the common mode input voltage Vcm varying linearly from 0 to VDDA, there are two ranges, namely the range II (in which the P-type comparator operates properly, while a current source of the N-type comparator operates in a linear mode) and the range IV (in which a current source of the P-type comparator operates in a linear mode, while the N-type comparator operates properly) shown in FIG. 1a, which leads to a high common mode gain but a poor CMRR, rendering the CMRR of the rail-to-rail input hysteresis comparator unstable.

SUMMARY OF THE INVENTION

It is a major objective of the present invention to overcome the drawback described above by presenting a rail-to-rail input hysteresis comparator which possesses a stable CMRR enabled by timely turn-off of PMOS transistors of its output comparator when a common mode input voltage is as low as to cause a linear operation of the PMOS transistors and by timely turn-off of NMOS transistors of its output comparator when the common mode input voltage is as high as to cause a linear operation of the NMOS transistors.

To achieve the above and other objectives, the present invention provides a rail-to-rail input hysteresis comparator which includes an input hysteresis comparator module, a transmission module, an output comparator, a switching signal module and a bias module, wherein: the input hysteresis comparator module includes a P-type input hysteresis comparator and an N-type input hysteresis comparator, the P-type input hysteresis comparator having a first input terminal, a second input terminal, a first output terminal, a second output terminal and a P-type common mode voltage control signal output terminal, the N-type input hysteresis comparator having a first input terminal, a second input terminal, a first output terminal, a second output terminal and an N-type common mode voltage control signal output terminal, the input hysteresis comparator module configured to receive a P-type input signal and an N-type input signal and to output a P-type hysteresis signal and an N-type hysteresis signal, each with hysteresis and steeper rise and fall edges relative to a respective one of the P-type input signal and the N-type input signal, to the transmission module and simultaneously a P-type common mode voltage control signal and an N-type common mode voltage control signal; the switching signal module is configured to convert the P-type and N-type common mode voltage control signals output from the input hysteresis comparator module to switching signals for the transmission module; the output comparator includes a P-type comparator and an N-type comparator, both coupled to the transmission module; the transmission module selectively couples one of the P-type and N-type hysteresis signals to the output comparator, under control of the switching signals, such that when the input P-type common mode voltage control signal is as low as to cause a decrease in a common mode rejection ratio, an output of the N-type input hysteresis comparator of the input hysteresis comparator module is disabled and an input voltage of the P-type comparator of the output comparator is set to a high level, thereby rendering the P-type comparator of the output comparator out of operation, and when the input N-type common mode voltage control signal is as high as to cause a decrease in the common mode rejection ratio, an output of the P-type input hysteresis comparator of the input hysteresis comparator module is disabled and an input voltage of the N-type comparator of the output comparator is set to a low level, thereby rendering the N-type comparator of the output comparator out of operation; and the bias module is configured to generate a bias current and a bias voltage, for each of the input hysteresis comparator module, the transmission module, the output comparator and the switching signal module.

Further, the output comparator may include first to seventh NMOS transistors and first to seventh PMOS transistors, the first to third NMOS transistors form the N-type comparator, the fourth and fifth PMOS transistors and the fourth and fifth NMOS transistors form a constant current source load, the first to third PMOS transistors form the P-type comparator, and the sixth and seventh PMOS transistors and the sixth and seventh NMOS transistors form an output buffer circuit.

Further, the first input terminals of the P-type and N-type input hysteresis comparators may be configured to receive the P-type input signal and the second input terminals of the P-type and N-type input hysteresis comparators are configured to receive the N-type input signal.

Further, the transmission module may include a first P-type comparator transmission gate, a second P-type comparator transmission gate, a third P-type comparator transmission gate, a fourth P-type comparator transmission gate, a first N-type comparator transmission gate, a second N-type comparator transmission gate, a third N-type comparator transmission gate and a fourth N-type comparator transmission gate.

Further, the output comparator may have first, second, third and fourth input terminals, each of the first and second P-type comparator transmission gates has one end coupled to a respective one of the first and second output terminals of the P-type input hysteresis comparator and the other end coupled to a respective one of the first and second input terminals of the output comparator; each of the third and fourth P-type comparator transmission gates has one end grounded and the other end coupled to a respective one of said other ends of the first and second P-type comparator transmission gates and thereby coupled to the respective one of the first and second input terminals of the output comparator; each of the first and second N-type comparator transmission gates has one end coupled to a respective one of the first and second output terminals of the N-type input hysteresis comparator and the other end coupled to a respective one of the third and fourth input terminals of the output comparator; and each of the third and fourth N-type comparator transmission gates has one end coupled to a supply voltage and the other end coupled to a respective one of said other ends of the first and second N-type comparator transmission gates and thereby coupled to the respective one of the third and fourth input terminals of the output comparator.

Further, the switching signal module may include a resistor voltage divider network, first and second comparators, and first, second, third and fourth phase inverters, each of the first and second comparators is coupled between the supply voltage and ground and has a first input terminal, a second input terminal and an output terminal; the first input terminals of the first and second comparators are coupled to the P-type and N-type common mode voltage control signals, respectively; the output terminal of the first comparator is coupled to the first and second phase inverters which are connected in series; the first phase inverter is configured to output a first switching signal and the second phase inverter is configured to output a second switching signal; the output terminal of the second comparator is coupled to the third and fourth phase inverters which are connected in series; the third phase inverter is configured to output a third switching signal and the fourth phase inverter is configured to output a fourth switching signal; each of the first, second, third and fourth phase inverters is coupled to both the supply voltage and the ground; the resistor voltage divider network is coupled between the supply voltage and the ground and includes a first resistor, a second resistor, a third resistor and a fourth resistor which are connected in series between the supply voltage and the ground; the second input terminal of the first comparator is coupled to a node between the first and second resistors; and the second input terminal of the second comparator is coupled to a node between the third and fourth resistors.

Further, each of the first, second, third and fourth P-type comparator transmission gates and the first, second, third and fourth N-type comparator transmission gates may include a PMOS transistor and an NMOS transistor; a gate terminal of the PMOS transistor of the first P-type comparator transmission gate is coupled to the second switching signal and a gate terminal of the NMOS transistor of the first P-type comparator transmission gate is coupled to the first switching signal; a gate terminal of the PMOS transistor of the second P-type comparator transmission gate is coupled to the second switching signal and a gate terminal of the NMOS transistor of the second P-type comparator transmission gate is coupled to the first switching signal; a gate terminal of the PMOS transistor of the third P-type comparator transmission gate is coupled to the first switching signal and a gate terminal of the NMOS transistor of the third P-type comparator transmission gate is coupled to the second switching signal; a gate terminal of the PMOS transistor of the fourth P-type comparator transmission gate is coupled to the first switching signal and a gate terminal of the NMOS transistor of the fourth P-type comparator transmission gate is coupled to the second switching signal; a gate terminal of the PMOS transistor of the first N-type comparator transmission gate is coupled to the third switching signal and a gate terminal of the NMOS transistor of the first N-type comparator transmission gate is coupled to the fourth switching signal; a gate terminal of the PMOS transistor of the second N-type comparator transmission gate is coupled to the third switching signal and a gate terminal of the NMOS transistor of the second N-type comparator transmission gate is coupled to the fourth switching signal; a gate terminal of the PMOS transistor of the third N-type comparator transmission gate is coupled to the fourth switching signal and a gate terminal of the NMOS transistor of the third N-type comparator transmission gate is coupled to the third switching signal; and a gate terminal of the PMOS transistor of the fourth N-type comparator transmission gate is coupled to the fourth switching signal and a gate terminal of the NMOS transistor of the fourth N-type comparator transmission gate is coupled to the third switching signal.

Further, the input hysteresis comparator module, the transmission module, the output comparator, the switching signal module and the bias module may be powered either by a same voltage source, or by different voltage sources used in combination with a level converter.

Compared to the conventional device, the rail-to-rail input hysteresis comparator of the present invention can turn off an output of the N-type input hysteresis comparator of the input hysteresis comparator module when the common mode input voltage is relatively low and turn off an output of the P-type input hysteresis comparator of the input hysteresis comparator module when the common mode input voltage is relatively high, thereby avoiding operating in a linear mode and hence achieving a stable CMRR.

DETAILED DESCRIPTION

To further describe the present invention, reference is made to the following detailed description on exemplary embodiments, taken in conjunction with the accompanying drawings. Other advantages and features of the invention will become readily apparent to those skilled in the art upon reading this specification. The invention may be embodied or utilized in many different forms from the exemplary embodiments and various modifications and variations can be made to details thereof based on different perspectives and applications, without departing from the spirit of the invention.

Figure 1A:
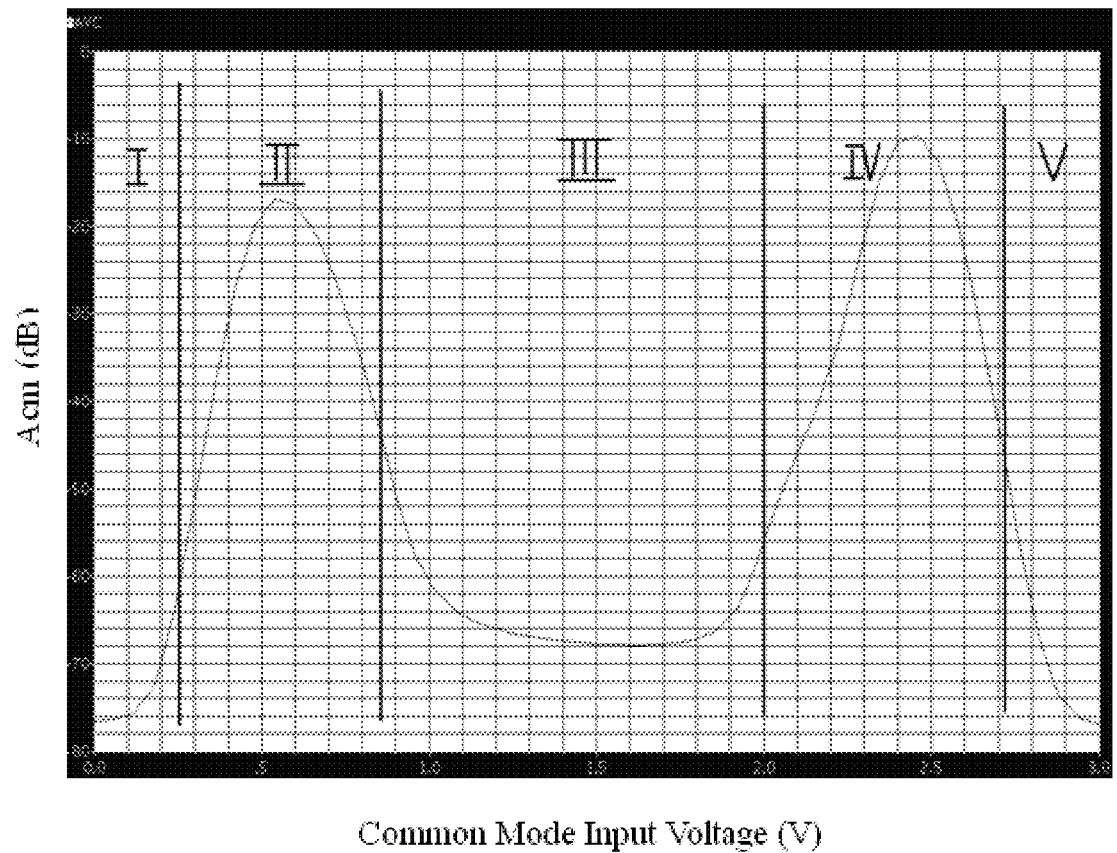
FIGS. 1a and 1b are diagrams showing simulation results of a conventional rail-to-rail input hysteresis comparator.
Figure 1B:
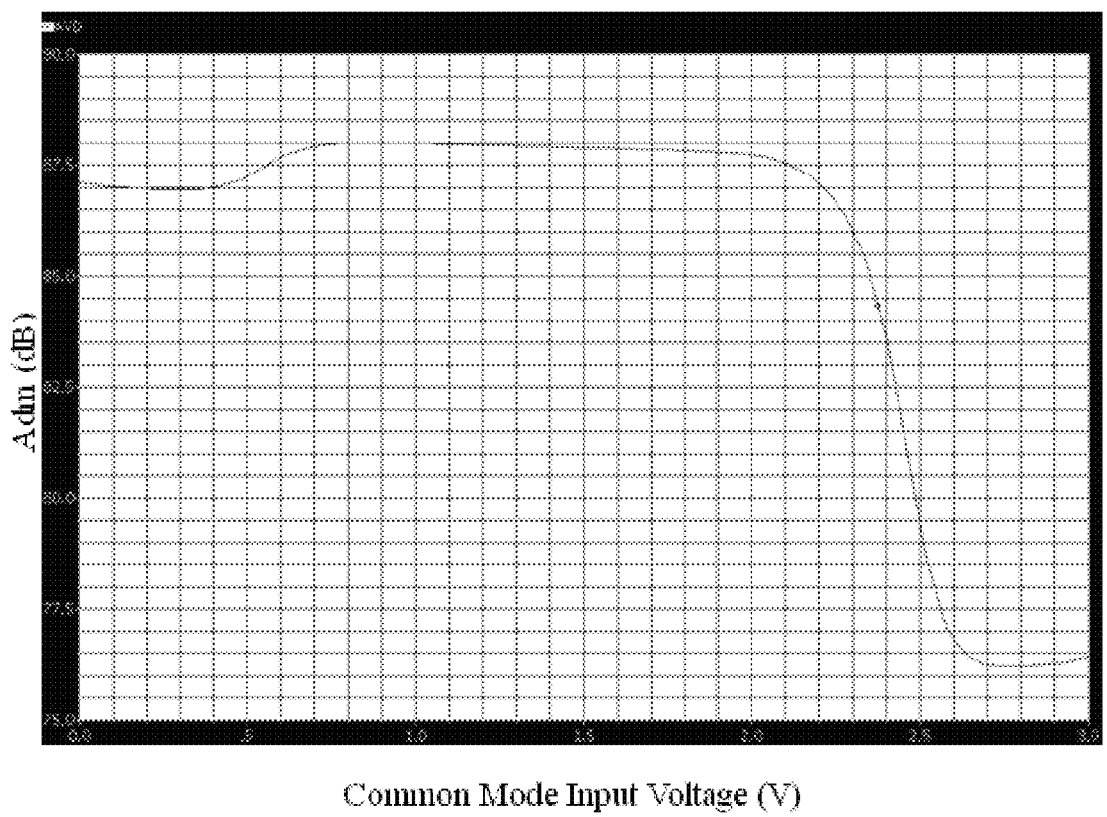
Figure 2:
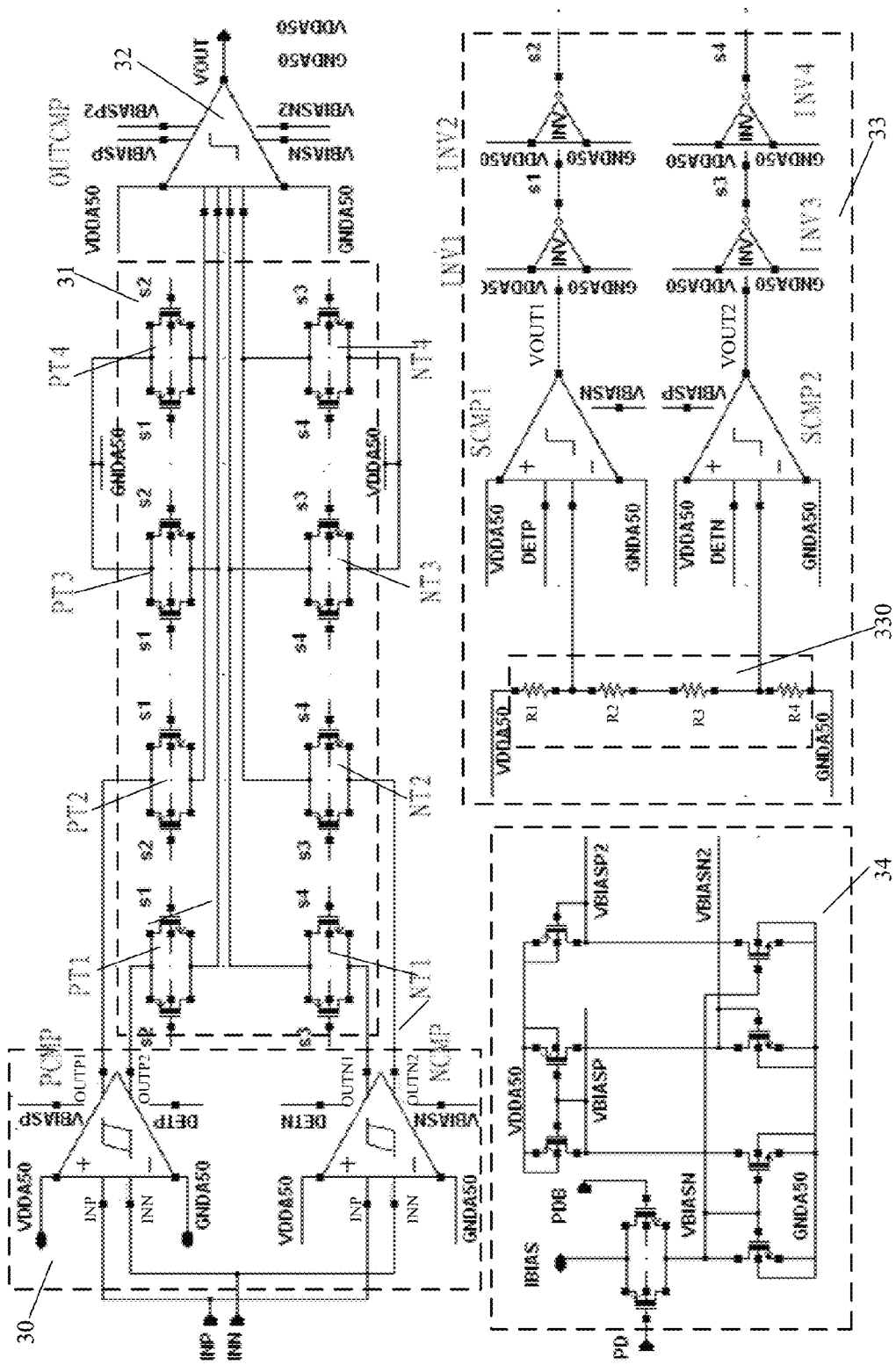
FIG. 2 illustrates a circuit schematic of a rail-to-rail input hysteresis comparator according to the present invention.

FIG. 2 illustrates a schematic diagram of a rail-to-rail input hysteresis comparator according to the present invention. As illustrated, the inventive rail-to-rail input hysteresis comparator includes at least an input hysteresis comparator module 30, a transmission module 31, an output comparator 32, a switching signal module 33 and a bias module 34. The input hysteresis comparator module 30 is coupled to the transmission module 31, and is configured to provide hysteresis to an input signal of arbitrary amplitude (rail-to-rail), i.e., to output a signal with hysteresis whose rise and fall edges are steeper than those of the input signal, and to simultaneously output two common mode voltage control signals from which the switching signal module 33 can generate switching signals for controlling the transmission module 31. The input hysteresis comparator module 30 can provide hysteresis separately with respect to high and low threshold voltages at increases or decreases of the input voltage according to actual design requirements. The transmission module 31 is configured to select one of the signals output from the input hysteresis comparator module 30 and other input signals (e.g., supply voltage or ground, and fixed high or low voltage) and output the selected signals to the output comparator 32, thereby disabling the output of an N-type comparator of the input hysteresis comparator module when the common mode input voltage is relatively low and disabling the output of a P-type comparator of the input hysteresis comparator module when the common mode input voltage is relatively high. The output comparator 32 is for gain and CMRR improvements of the rail-to-rail input hysteresis comparator and further rectification of the selection of the transmission module 31. The switching signal module 33 is configured to convert the common mode voltage control signals output from the input hysteresis comparator module to the switching signals for the transmission module 31. The bias module 34 is configured to supply a bias current and a bias voltage to each of the preceding modules.

The input hysteresis comparator module 30 includes a P-type input hysteresis comparator PCMP and an N-type input hysteresis comparator NCMP, each powered by a supply voltage VDDA50 relative to ground GNDA50 of the system and having two input terminals, one positive and one negative, and two output terminals, also one positive and one negative. Each positive input terminal of the PCMP and NCMP is configured to receive a positive input signal INP, while each negative input terminal of the PCMP and NCMP is configured to receive a negative input signal INN. Signals with hysteresis are output from the output terminals OUTP1, OUTP2 of the PCMP and OUTN1 and OUTN2 of the NCMP to the transmission module 31. The P-type input hysteresis comparator PCMP is coupled to a bias signal VBIASP from the bias module 34 and outputs a P-type common mode voltage control signal DETP through source terminal nodes of PMOS transistors P1 and P2 of the PCMP (see FIG. 4a). The N-type input hysteresis comparator NCMP is coupled to another bias signal VBIASN from the bias module 34 and outputs an N-type common mode voltage control signal DETN through source terminal nodes of NMOS transistors N1 and N2 of the NCMP (see FIG. 4b). As such, when the common mode input voltage is as low as (reflected as a low DETN) to cause the PMOS transistors of the output comparator 32 to operate in a linear mode, the output of the N-type input hysteresis comparator NCMP of the input hysteresis comparator module 30 is disabled in time in response to the N-type common mode voltage control signal DETN and the supply voltage is then coupled to and thereby cuts off the PMOS transistors of the output comparator 32, and when the common mode input voltage is as high as (reflected as a high DETP) to cause the NMOS transistors of the output comparator 32 to operate in a linear mode, the output of the P-type input hysteresis comparator PCMP of the input hysteresis comparator module 30 is disabled in time in response to the P-type common mode voltage control signal DETP and the ground voltage is then coupled to and thereby cuts off the PMOS transistors of the output comparator 32.

The transmission module 31 includes a first P-type comparator transmission gate PT1, a second P-type comparator transmission gate PT2, a third P-type comparator transmission gate PT3, a fourth P-type comparator transmission gate PT4, a first N-type comparator transmission gate NT1, a second N-type comparator transmission gate NT2, a third N-type comparator transmission gate NT3 and a fourth N-type comparator transmission gate NT4. These transmission gates may, under the control of the switching signals from the switching signal module 33, select ones of the signals output from the input hysteresis comparator module 30 and other input signals and output the selected signals to the output comparator 32. Each of the first and second P-type comparator transmission gates PT1 and PT2 has one end coupled to a respective one of the first and second output terminals OUTP1 and OUTP2 of the P-type input hysteresis comparator PCMP and the other end coupled to a respective one of the first and second input terminals VINP1 and VINP2 of the output comparator 32. Each of the third and fourth P-type comparator transmission gates PT3 and PT4 has one end coupled to the ground GNDA50 and the other end coupled to a respective one of said other ends of the first and second P-type comparator transmission gates PT1 and PT2 and thereby coupled to the respective one of the first and second input terminals VINP1 and VINP2 of the output comparator 32. Each of the first and second N-type comparator transmission gates NT1 and NT2 has one end coupled to a respective one of the first and second output terminals OUTN1 and OUTN2 of the N-type input hysteresis comparator NCMP and the other end coupled to a respective one of input terminals VINN1 and VINN2 of the output comparator 32. Each of the third and fourth N-type comparator transmission gates NT3 and NT4 has one end coupled to the supply voltage VDDA50 and the other end coupled to a respective one of said other ends of the first and second N-type comparator transmission gates NT1 and NT2 and thereby coupled to the respective one of input terminals VINN1 and VINN2 of the output comparator 32. In a preferred embodiment, each of the first, second, third and fourth P-type comparator transmission gates PT1, PT2, PT3 and PT4 and the first, second, third and fourth N-type comparator transmission gates NT1, NT2, NT3 and NT4 includes a PMOS transistor and an NMOS transistor. Additionally, a gate terminal of the PMOS transistor of the first P-type comparator transmission gate PT1 is coupled to a second switching signal S2 and a gate terminal of the NMOS transistor of the first P-type comparator transmission gate PT1 is coupled to a first switching signal S1. A gate terminal of the PMOS transistor of the second P-type comparator transmission gate PT2 is coupled to the second switching signal S2 and a gate terminal of the NMOS transistor of the second P-type comparator transmission gate PT2 is coupled to the first switching signal S1. A gate terminal of the PMOS transistor of the third P-type comparator transmission gate PT3 is coupled to the first switching signal S1 and a gate terminal of the NMOS transistor of the third P-type comparator transmission gate PT3 is coupled to the second switching signal S2. A gate terminal of the PMOS transistor of the fourth P-type comparator transmission gate PT4 is coupled to the first switching signal S1 and a gate terminal of the NMOS transistor of the fourth P-type comparator transmission gate PT4 is coupled to the second switching signal S2. A gate terminal of the PMOS transistor of the first N-type comparator transmission gate NT1 is coupled to a third switching signal S3 and a gate terminal of the NMOS transistor of the first N-type comparator transmission gate NT1 is coupled to a fourth switching signal S4. A gate terminal of the PMOS transistor of the second N-type comparator transmission gate NT2 is coupled to the third switching signal S3 and a gate terminal of the NMOS transistor of the second N-type comparator transmission gate NT2 is coupled to the fourth switching signal S4. A gate terminal of the PMOS transistor of the third N-type comparator transmission gate NT3 is coupled to the fourth switching signal S4 and a gate terminal of the NMOS transistor of the third N-type comparator transmission gate NT3 is coupled to the third switching signal S3. A gate terminal of the PMOS transistor of the fourth N-type comparator transmission gate NT4 is coupled to the fourth switching signal S4 and a gate terminal of the NMOS transistor of the fourth N-type comparator transmission gate NT4 is coupled to the third switching signal S3.

The switching signal module 33 includes a resistor voltage divider network 330, a first comparator SCMP1, a second comparator SCMP2 and first, second, third and fourth phase inverters INV1, INV2, INV3 and INV4. The resistor voltage divider network 330 is coupled between the supply voltage VDDA50 and the ground GNDA50 and includes serially connected first, second, third and fourth resistors R1, R2, R3 and R4. A node between the first and second resistors R1 and R2 is coupled to a negative input terminal of the first comparator SCMP1, and a node between the third and fourth resistors R3 and R4 is coupled to a negative input terminal of the second comparator SCMP2. Each of the first and second comparators SCMP1 and SCMP2 is powered by the supply voltage VDDA50 and coupled to a respective one of the bias voltages VBIASN and VBIASP. A positive input terminal of each of the first and second comparators SCMP1 and SCMP2 is coupled to a respective one of the P-type and N-type common mode input voltages DETP and DETN. An output terminal of the first comparator SCMP1 is coupled to the first and second phase inverters INV1 and INV2. The first phase inverter INV1 outputs the first switching signal S1 and the second phase inverter INV2 outputs the second switching signal S2. An output terminal of the second comparator SCMP2 is coupled to the third and fourth phase inverters INV3 and INV4. The third phase inverter INV3 outputs the third switching signal S3 and the fourth phase inverter INV4 outputs the fourth switching signal S4. The four phase inverters INV1, INV2, INV3 and INV4 are all powered by the supply voltage VDDA50.

The output comparator 32 is for gain and CMRR improvement of the rail-to-rail input hysteresis comparator and rectification of the selected signals of the transmission module 31 and is powered by the supply voltage VDDA50. In order to enable the output comparator 32 to receive the selected signals of the transmission module 31, the output comparator 32 has four input terminals, each coupled to two of the transmission gates. After the rectification, the output comparator 32 provides an output VOUT. Further, the output comparator 32 is also coupled to the bias module 34 and thus capable of receiving bias voltages VBIASP, VBIASN, VBIASP2 and VBIASN2.

The bias module 34 is configured to provide the bias voltages VBIASP, VBIASN, VBIASP2 and VBIASN2 for the other modules described above. As the bias module 34 may be implemented as a conventionally known bias circuit, a detailed description is omitted herein.

Figure 3:
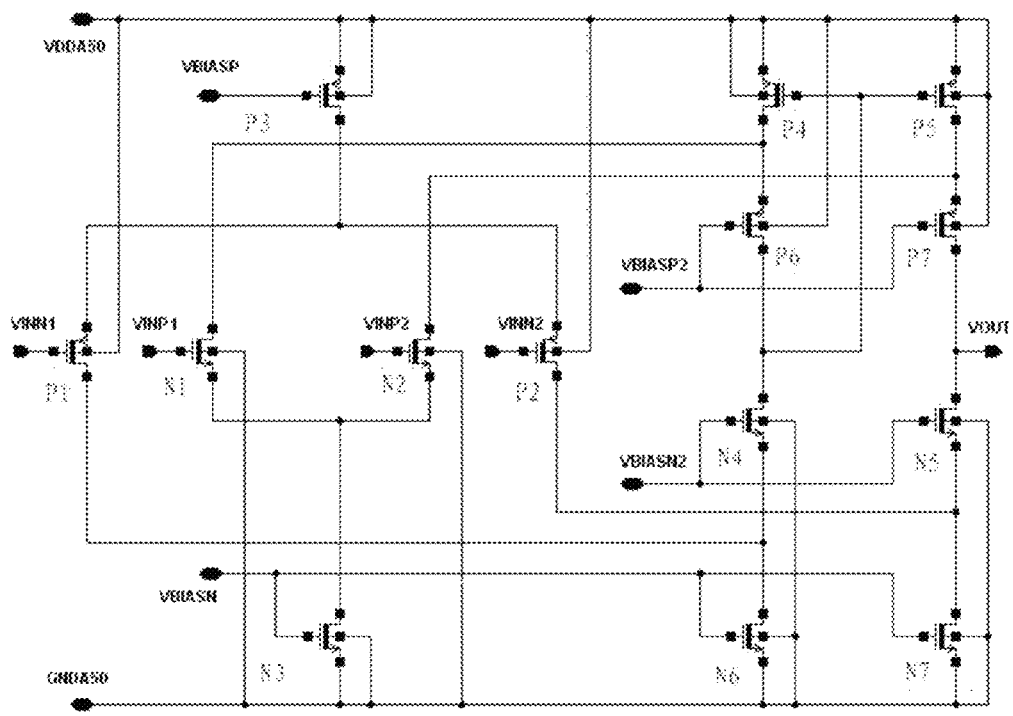
FIG. 3 shows a detailed circuit schematic of an output comparator 32 in accordance with a preferred embodiment of the present invention.

FIG. 3 is a detailed circuit schematic of the output comparator 32 in accordance with a preferred embodiment of the present invention. In this embodiment, the output comparator 32 includes first to seventh NMOS transistors N1 to N7 and first to seventh PMOS transistors P1 to P7, in which, the first to third NMOS transistors N1 to N3 form an N-type comparator, the fourth and fifth PMOS transistors P4 and P5 and the fourth and fifth NMOS transistors N4 and N5 form a constant current source load, the first to third PMOS transistors P1 to P3 form a P-type comparator, and the sixth and seventh PMOS transistors P6 and P7 and the sixth and seventh NMOS transistors N6 and N7 form an output buffer circuit.

Figure 4A:
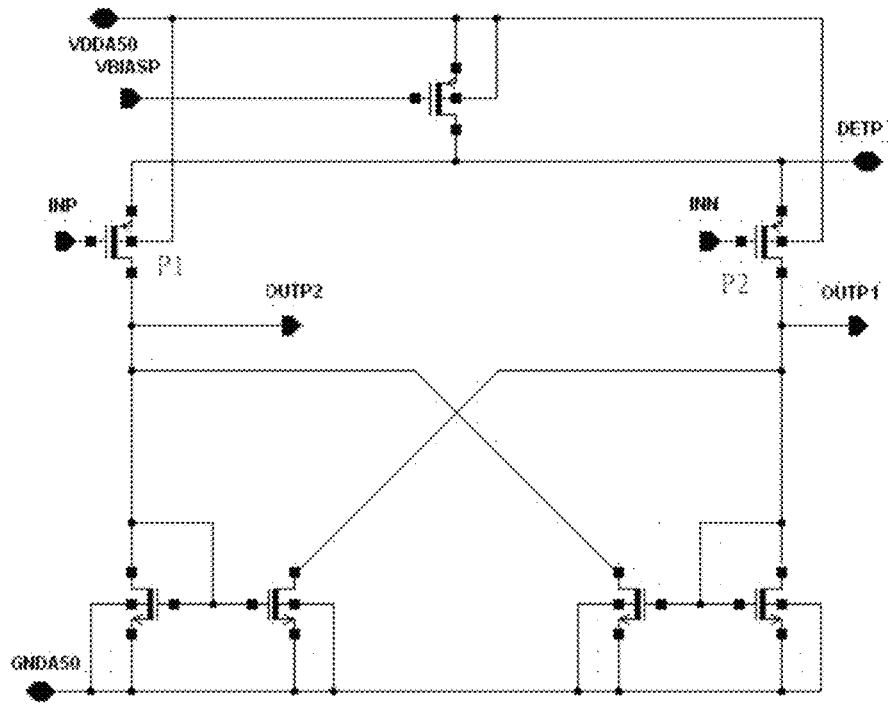
FIG. 4a shows a detailed circuit schematic of a P-type input hysteresis comparator PCMP in accordance with a preferred embodiment of the present invention.
Figure 4B:
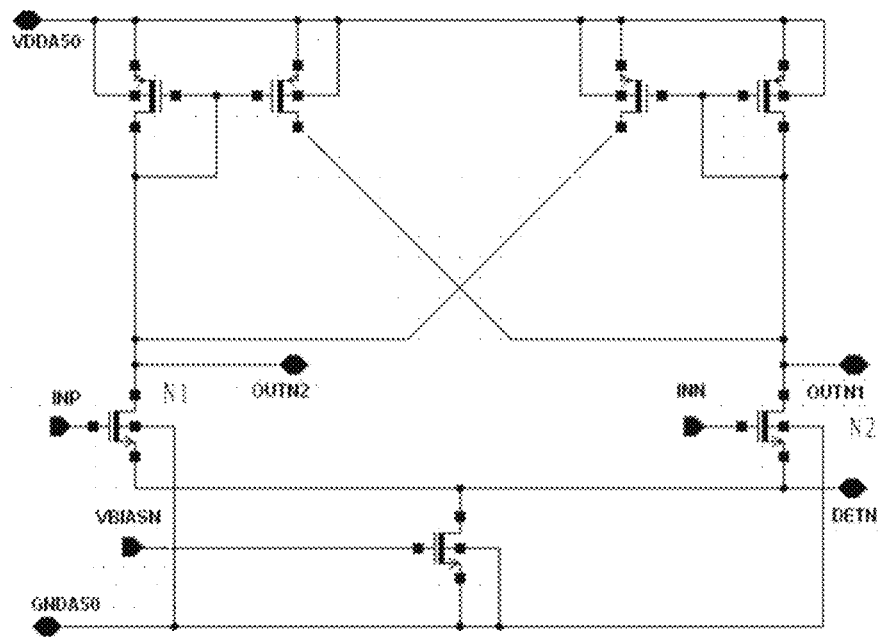
FIG. 4b shows a detailed circuit schematic of an N-type input hysteresis comparator NCMP in accordance with a preferred embodiment of the present invention.

FIG. 4a is a detailed circuit schematic of the P-type input hysteresis comparator PCMP in accordance with a preferred embodiment of the present invention, and FIG. 4b shows a detailed circuit schematic of the N-type input hysteresis comparator NCMP in accordance with a preferred embodiment of the present invention. As illustrated, the P-type input hysteresis comparator PCMP may have a similar architecture as an ordinary comparator expect having differential pair P1 and P2 whose sources are coupled to the output terminal from which the P-type common mode input voltage DETP is output, and the N-type input hysteresis comparator NCMP may also have a similar architecture as an ordinary comparator expect having differential pair N1 and N2 whose sources are coupled to the output terminal from which the N-type common mode input voltage DETN is output.

Figure 5A:
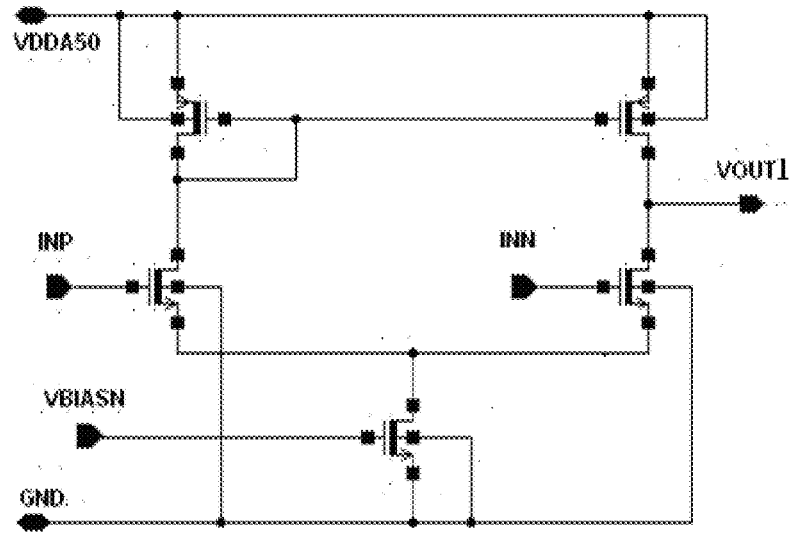
FIGS. 5a and 5b shows detailed circuit schematics of first and second comparators SCMP1 and SCMP2 of a switching signal module in accordance with a preferred embodiment of the present invention.
Figure 5B:
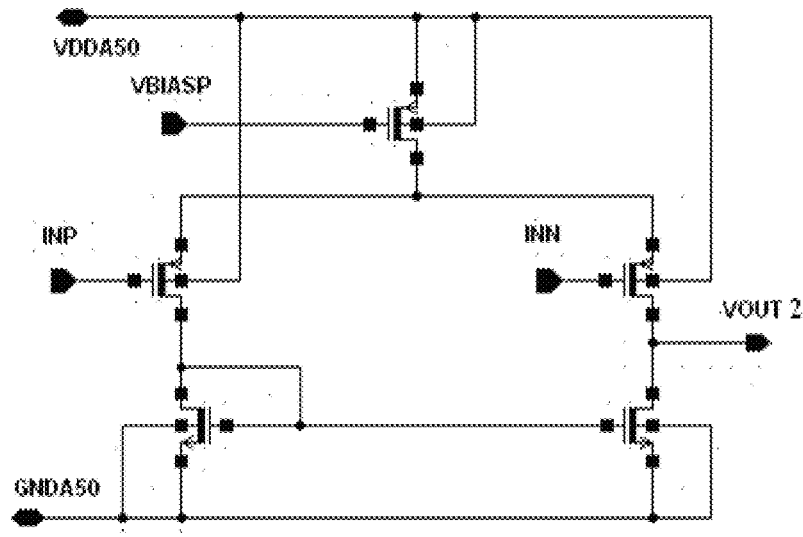

FIGS. 5a and 5b are detailed circuit schematics of the first and second comparators SCMP1 and SCMP2 of the switching signal module 33 in accordance with a preferred embodiment of the present invention. As each of the first and second comparators SCMP1 and SCMP2 may be implemented as a conventionally known bias circuit, a detailed description is omitted herein.

In the embodiment, the input hysteresis comparator module 30, the transmission module 31, the output comparator 32, the switching signal module 33 and the bias module 34 are powered either by a same voltage source, or by different voltage sources used in combination with a level converter.

Operating principles of the present invention will be described in greater detail below with reference to FIGS. 2 to 5a and 5b.

When a low common mode input voltage is input, the output common mode voltage control signals DETP and DETN (i.e., the P-type and N-type common mode voltage control signals) are also low, as shown in FIGS. 4a and 4b. As a result, the output VOUT1 is low, as shown in FIG. 5a, and hence S1 is high (i.e. S1=1) and S2 is low (i.e. S2=0); and the output VOUT2 is also low, as shown in FIG. 5b, and hence S3 is high (i.e. S3=1) and S4 is low (i.e. S4=0). Under the conditions S1 is high (i.e. S1=1) and S2 is low (i.e. S2=0), the transmission gates PT1 and PT2 are switched on and the transmission gates PT3 and PT4 are cut off, shunting the output terminals OUTP1 and OUTP2 of the P-type input hysteresis comparator PCMP to the input terminals VINP1 and VINP2 of the output comparator 32 and hence activating the operation of the N-type comparator of the output comparator 32. In addition, under the conditions S3 is high (i.e. S3=1) and S4 is low (i.e. S4=0), the transmission gates NT1 and NT2 are cut off and the transmission gates NT3 and NT4 are switched on, isolating the output terminals OUTN1 and OUTN2 of the N-type input hysteresis comparator and shunting the supply voltage on the input terminals VINN1 and VINN2 of the output comparator 32. As a result, the P-type comparator of the output comparator 32 remains out of operation due to a high voltage on the gate terminal.

When the common mode input voltage is high, the output common mode voltage control signals DETP and DETN (i.e., the P-type and N-type common mode voltage control signals) are also high, as shown in FIGS. 4a and 4b. As a result, the output VOUT1 is high, as shown in FIG. 5a, and hence S1 is low (i.e. S1=0) and S2 is high (i.e. S2=1); and the output VOUT2 is also high, as shown in FIG. 5b, and hence S3 is low (i.e. S3=0) and S4 is high (i.e. S4=1). Under the conditions S1 is low (i.e. S1=0) and S2 is high (i.e. S2=1), the transmission gates PT1 and PT2 are cut off and the transmission gates PT3 and PT4 are switched on, thereby isolating the output terminals OUTP1 and OUTP2 of the P-type input hysteresis comparator PCMP and shunting the ground GNDA50 on the input terminals VINP1 and VINP2 of the output comparator 32. In this state, the N-type comparator of the output comparator 32 remains out of operation due to a high voltage on the gate terminal. Further, under the conditions S3 is high (i.e. S3=1) and S4 is low (i.e. S4=0), the transmission gates NT1 and NT2 are switched on and the transmission gates NT3 and NT4 are cut off, shunting the output terminals OUTN1 and OUTN2 of the N-type input hysteresis comparator NCMP to the input terminals VINN1 and VINN2 of the output comparator 32. This activates the operation of the P-type comparator of the output comparator 32.

Figure 6A:
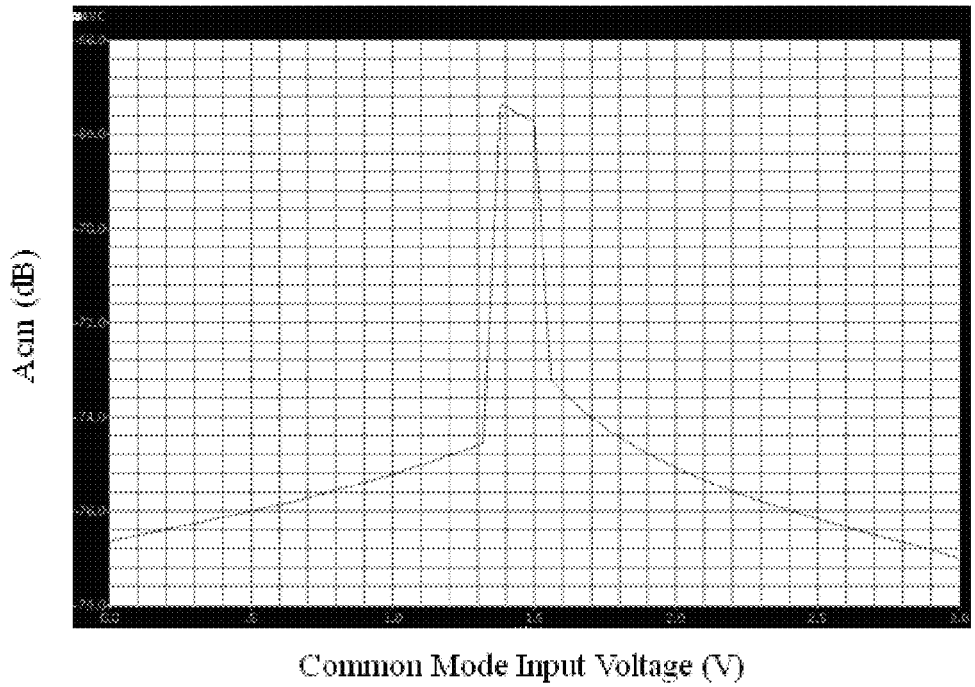
FIGS. 6a and 6b are diagrams showing simulation results of a rail-to-rail input hysteresis comparator according to the present invention.
Figure 6B:
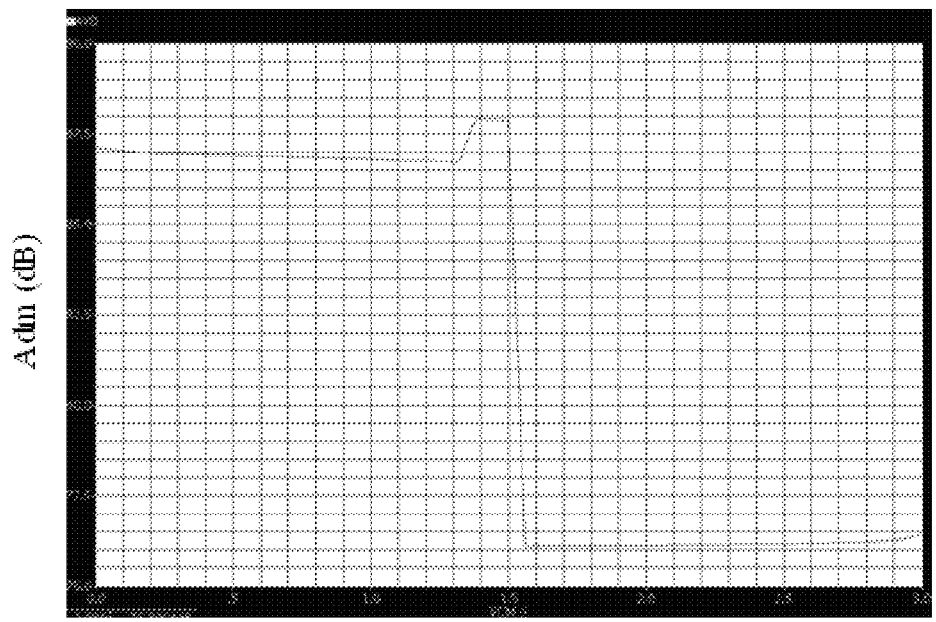

As can be seen from FIGS. 6a and 6b, that show simulation results according to the present invention, there has been obtained a common mode gain (minimum at −66 dB) in the rail-to-rail common mode input voltage range, that is obviously smaller than the common mode gain (minimum at −10 dB) of the conventional device in the same range, i.e., a remarkable improvement in CMRR.

As described above, the rail-to-rail input hysteresis comparator of the present invention is capable of, by means of the common mode voltage control signals DETP and DETN output from the input hysteresis comparators, disabling the output of the N-type input hysteresis comparator NCMP and turning off the PMOS transistors of the output comparator in time in the event of a low common mode input voltage and disabling the output of the P-type input hysteresis comparator PCMP and turning off the NMOS transistors of the output comparator in time in the event of a high common mode input voltage, thereby cutting off any passage for the transmission of the common mode voltage during its linear operations and hence achieving an increased CMRR.

The exemplary embodiments disclosed above is merely intended to describe the principles and beneficial effects of the present invention by way of illustration and are not intended to limit the invention in any way. Those skilled in the art can make various modifications and variations without departing from the spirit and scope of the invention. Thus, it is intended that the scope of the present invention is defined by the appended claims.

What is claimed is:

1. A rail-to-rail input hysteresis comparator, comprising an input hysteresis comparator module, a transmission module, an output comparator, a switching signal module and a bias module, wherein:

the input hysteresis comparator module comprises a P-type input hysteresis comparator and an N-type input hysteresis comparator, the P-type input hysteresis comparator having a first input terminal, a second input terminal, a first output terminal, a second output terminal and a P-type common mode voltage control signal output terminal, the N-type input hysteresis comparator having a first input terminal, a second input terminal, a first output terminal, a second output terminal and an N-type common mode voltage control signal output terminal, the input hysteresis comparator module configured to receive a P-type input signal and an N-type input signal and to output a P-type hysteresis signal and an N-type hysteresis signal, each with hysteresis and steeper rise and fall edges relative to a respective one of the P-type input signal and the N-type input signal, to the transmission module and simultaneously a P-type common mode voltage control signal and an N-type common mode voltage control signal;

the switching signal module is configured to convert the P-type and N-type common mode voltage control signals output from the input hysteresis comparator module to switching signals for the transmission module;

the output comparator comprises a P-type comparator and an N-type comparator, both coupled to the transmission module;

the transmission module selectively couples one of the P-type and N-type hysteresis signals to the output comparator, under control of the switching signals, such that when the input P-type common mode voltage control signal is as low as to cause a decrease in a common mode rejection ratio, an output of the N-type input hysteresis comparator of the input hysteresis comparator module is disabled and an input voltage of the P-type comparator of the output comparator is set to a high level, thereby rendering the P-type comparator of the output comparator out of operation, and when the input N-type common mode voltage control signal is as high as to cause a decrease in the common mode rejection ratio, an output of the P-type input hysteresis comparator of the input hysteresis comparator module is disabled and an input voltage of the N-type comparator of the output comparator is set to a low level, thereby rendering the N-type comparator of the output comparator out of operation; and the bias module is configured to generate a bias current and a bias voltage, for each of the input hysteresis comparator module, the transmission module, the output comparator and the switching signal module.

2. The rail-to-rail input hysteresis comparator of claim 1, wherein the output comparator comprises first to seventh NMOS transistors and first to seventh PMOS transistors, wherein the first to third NMOS transistors form the N-type comparator, the fourth and fifth PMOS transistors and the fourth and fifth NMOS transistors form a constant current source load, the first to third PMOS transistors form the P-type comparator, and the sixth and seventh PMOS transistors and the sixth and seventh NMOS transistors form an output buffer circuit.

3. The rail-to-rail input hysteresis comparator of claim 1, wherein the first input terminals of the P-type and N-type input hysteresis comparators are configured to receive the P-type input signal and the second input terminals of the P-type and N-type input hysteresis comparators are configured to receive the N-type input signal.

4. The rail-to-rail input hysteresis comparator of claim 3, wherein: the transmission module comprises a first P-type comparator transmission gate, a second P-type comparator transmission gate, a third P-type comparator transmission gate, a fourth P-type comparator transmission gate, a first N-type comparator transmission gate, a second N-type comparator transmission gate, a third N-type comparator transmission gate and a fourth N-type comparator transmission gate.

5. The rail-to-rail input hysteresis comparator of claim 4, wherein: the output comparator has first, second, third and fourth input terminals; each of the first and second P-type comparator transmission gates has one end coupled to a respective one of the first and second output terminals of the P-type input hysteresis comparator and the other end coupled to a respective one of the first and second input terminals of the output comparator; each of the third and fourth P-type comparator transmission gates has one end grounded and the other end coupled to a respective one of said other ends of the first and second P-type comparator transmission gates and thereby coupled to the respective one of the first and second input terminals of the output comparator; each of the first and second N-type comparator transmission gates has one end coupled to a respective one of the first and second output terminals of the N-type input hysteresis comparator and the other end coupled to a respective one of the third and fourth input terminals of the output comparator; and each of the third and fourth N-type comparator transmission gates has one end coupled to a supply voltage and the other end coupled to a respective one of said other ends of the first and second N-type comparator transmission gates and thereby coupled to the respective one of the third and fourth input terminals of the output comparator.

6. The rail-to-rail input hysteresis comparator of claim 5, wherein: the switching signal module comprises a resistor voltage divider network, first and second comparators, and first, second, third and fourth phase inverters; each of the first and second comparators is coupled between the supply voltage and ground and has a first input terminal, a second input terminal and an output terminal; the first input terminals of the first and second comparators are coupled to the P-type and N-type common mode voltage control signals, respectively; the output terminal of the first comparator is coupled to the first and second phase inverters which are connected in series; the first phase inverter is configured to output a first switching signal and the second phase inverter is configured to output a second switching signal; the output terminal of the second comparator is coupled to the third and fourth phase inverters which are connected in series; the third phase inverter is configured to output a third switching signal and the fourth phase inverter is configured to output a fourth switching signal; each of the first, second, third and fourth phase inverters is coupled to both the supply voltage and the ground; the resistor voltage divider network is coupled between the supply voltage and the ground and comprises a first resistor, a second resistor, a third resistor and a fourth resistor which are connected in series between the supply voltage and the ground; the second input terminal of the first comparator is coupled to a node between the first and second resistors; and the second input terminal of the second comparator is coupled to a node between the third and fourth resistors.

7. The rail-to-rail input hysteresis comparator of claim 6, wherein: each of the first, second, third and fourth P-type comparator transmission gates and the first, second, third and fourth N-type comparator transmission gates comprises a PMOS transistor and an NMOS transistor; a gate terminal of the PMOS transistor of the first P-type comparator transmission gate is coupled to the second switching signal and a gate terminal of the NMOS transistor of the first P-type comparator transmission gate is coupled to the first switching signal; a gate terminal of the PMOS transistor of the second P-type comparator transmission gate is coupled to the second switching signal and a gate terminal of the NMOS transistor of the second P-type comparator transmission gate is coupled to the first switching signal; a gate terminal of the PMOS transistor of the third P-type comparator transmission gate is coupled to the first switching signal and a gate terminal of the NMOS transistor of the third P-type comparator transmission gate is coupled to the second switching signal; a gate terminal of the PMOS transistor of the fourth P-type comparator transmission gate is coupled to the first switching signal and a gate terminal of the NMOS transistor of the fourth P-type comparator transmission gate is coupled to the second switching signal; a gate terminal of the PMOS transistor of the first N-type comparator transmission gate is coupled to the third switching signal and a gate terminal of the NMOS transistor of the first N-type comparator transmission gate is coupled to the fourth switching signal; a gate terminal of the PMOS transistor of the second N-type comparator transmission gate is coupled to the third switching signal and a gate terminal of the NMOS transistor of the second N-type comparator transmission gate is coupled to the fourth switching signal; a gate terminal of the PMOS transistor of the third N-type comparator transmission gate is coupled to the fourth switching signal and a gate terminal of the NMOS transistor of the third N-type comparator transmission gate is coupled to the third switching signal; and a gate terminal of the PMOS transistor of the fourth N-type comparator transmission gate is coupled to the fourth switching signal and a gate terminal of the NMOS transistor of the fourth N-type comparator transmission gate is coupled to the third switching signal.

8. The rail-to-rail input hysteresis comparator of claim 1, wherein the input hysteresis comparator module, the transmission module, the output comparator, the switching signal module and the bias module are powered either by a same voltage source, or by different voltage sources used in combination with a level converter.

\* \* \* \* \*